US007969201B2

(12) United States Patent
Hanyu

(10) Patent No.: US 7,969,201 B2
(45) Date of Patent: Jun. 28, 2011

(54) DECODER CIRCUIT

(75) Inventor: Tomohiro Hanyu, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/700,023

(22) Filed: Feb. 4, 2010

(65) Prior Publication Data

US 2010/0201401 A1 Aug. 12, 2010

(30) Foreign Application Priority Data

Feb. 12, 2009 (JP) ................................ 2009-030044

(51) Int. Cl.
*G11C 8/00* (2006.01)
*G09G 3/36* (2006.01)

(52) U.S. Cl. ........................................ 326/108; 345/98

(58) Field of Classification Search ........... 326/105–108
See application file for complete search history.

(56) References Cited

U.S. PATENT DOCUMENTS 5,262,687 A * 11/1993 Benhamida .................. 326/106
5,982,702 A * 11/1999 Bosshart .................. 365/230.06
6,518,946 B2 * 2/2003 Ode et al. ........................ 345/98
2001/0024183 A1 * 9/2001 Ode et al. ........................ 345/87
2006/0238473 A1 * 10/2006 Hashimoto ..................... 345/89

FOREIGN PATENT DOCUMENTS

JP 2007-232977 A 9/2007

* cited by examiner

*Primary Examiner* — Rexford N Barnie
*Assistant Examiner* — Dylan White
(74) *Attorney, Agent, or Firm* — Volentine & Whitt, PLLC

(57) ABSTRACT

A decoder circuit that can prevent the delay of decoder output includes a switch that is put into an ON state when a node A of an NMOS region is not an output channel of a selected gradation voltage. The switch is connected to the node A. Thus, a voltage raised by electric charges accumulated by a coupling capacity C1 caused in the node A when the gradation voltage is outputted from an output terminal of the decoder output can be discharged by the switch in the ON state.

6 Claims, 9 Drawing Sheets

DECODER CIRCUIT

CROSS-REFERENCE TO RELATED APPLICATION

This application claims priority under 35 USC 119 from Japanese Patent Application No. 2009-030044, filed on Feb. 12, 2009, the disclosure of which is incorporated by reference herein.

BACKGROUND OF THE INVENTION

1. Field of the Invention

The present invention relates to a decoder circuit in an LCD drive apparatus.

2. Description of the Related Art

In a drive apparatus for driving a display apparatus such as a TFT (Thin Film Transistor) type LCD (Liquid Crystal Display) panel, there is a decoder circuit having a configuration called a tournament system (e.g., refer to Japanese Patent Application Laid-Open (JP-A) No. 2007-232977). The decoder circuit outputs gradation voltages in accordance with image data.

A specific example of such a decoder circuit of the tournament system is shown in FIG. 6. A decoder circuit 110 shown in FIG. 6 is a decoder circuit used in an LCD drive apparatus for 1024 gradation display.

The decoder circuit 110 includes an NMOS region 112 and a PMOS region 114. The NMOS region 112 has a hierarchical structure of five hierarchies made of a MOS transistor group, in which plural NMOS transistors are arrayed in a tournament manner. The PMOS region 114 has a hierarchical structure of five hierarchies made of a MOS transistor group, in which plural PMOS transistors are arrayed in a tournament manner.

In the NMOS region 112, ON/OFF of the NMOS transistors is controlled by predecode signals inputted to four predecode signal lines in each hierarchy (a first hierarchy: predecode signal lines DA00 to DA11, a second hierarchy: predecode signal lines DB00 to DB11, a third hierarchy: predecode signal lines DC00 to DC11, a fourth hierarchy: predecode signal lines DD00 to DD11, and a fifth hierarchy: predecode signal lines DE00 to DE11).

In the PMOS region 114, ON/OFF of the PMOS transistors is controlled by predecode signals inputted to four predecode signal lines in each hierarchy (a first hierarchy: predecode signal lines XDA00 to XDA11, a second hierarchy: predecode signal lines XDB00 to XDB11, a third hierarchy: predecode signal lines XDC00 to XDC11, a fourth hierarchy: predecode signal lines XDD00 to XDD11, and a fifth hierarchy: predecode signal lines XDE00 to XDE11).

In the decoder circuit 110, with both of the NMOS region 112 and the PMOS region 114, one MOS transistor (of one channel) is turned ON by the predecode signals of the four lines in each of the hierarchies. Due thereto, a gradation voltage selected from gradation voltages at 1024 levels of gradation voltages VR0 to VR1023 is outputted from a decoder output terminal DECOUT.

In the decoder circuit 110, the selected gradation voltage is outputted from the decoder output terminal DECOUT. At this time, however, decoder delay may be caused by a coupling capacity.

For example, when a node A 160, which is wiring between MOS transistors of the decoder circuit 110, and wiring of the decoder output DECOUT are close to each other (especially when they are adjacent and parallel to each other), a coupling capacity is caused in the node A 160. Hereinafter, a specific example of the case where the coupling capacity is caused is described. As shown in FIG. 7, when the decoder circuit 110 is laid out as shown in the figure, the node A 160 and wiring 164 of the decoder output DECOUT are close to each other. Due thereto, when the decoder output DECOUT (a gradation voltage) is outputted via other wiring and the wiring 164 without passing through the node A 160, a coupling capacity C1 is caused in the node A 160. Referring to FIG. 8, a specific example in the foregoing case is described as a case where in the decoder circuit 110 in a layout diagram of FIG. 7, a gradation voltage VR540 (a gradation signal indicating the VR540) is selected by the predecode signal to be outputted from the output terminal of the decoder output DECOUT.

FIG. 8 shows only output channels of gradation voltages VR28, VR284, VR540, and VR796 in the decoder circuit 110. When the gradation voltage VR540 is outputted from the output terminal of the decoder output DECOUT, NMOS transistors in the NMOS region 112 with the predecode signal lines DA00, DB11, DC01, DD00 connected to gates thereof are put into an ON state. Moreover, NMOS transistors $\mathbf{145}_1$, $\mathbf{145}_2$, $\mathbf{145}_4$ with the predecode signal lines DE00, DE01, DE11 connected to gates thereof are put into an OFF state. Accordingly, an NMOS transistor $\mathbf{145}_3$ with the predecode signal line DE10 connected to a gate thereof is put into an ON state.

On the other hand, PMOS transistors in the PMOS region 114 with the predecode signal lines XDA00, XDB11, XDC01, XDD00 connected to gates thereof are put into an ON state. Moreover, PMOS transistors $\mathbf{155}_1$, $\mathbf{155}_2$, $\mathbf{155}_4$ with the predecode signal lines XDE00, XDE01, XDE11 connected to gates thereof are put into an OFF state. Accordingly, a PMOS transistor $\mathbf{155}_3$ with the predecode signal line XDE10 connected to a gate thereof is put into an ON state.

Accordingly, the gradation voltage VR540 passes through NMOS transistors $\mathbf{141}_{540}$, $\mathbf{142}_{136}$, $\mathbf{143}_{34}$, $\mathbf{144}_{11}$, $\mathbf{145}_3$, and the wiring 164. The gradation voltage VR540 also passes through PMOS transistors $\mathbf{151}_{540}$, $\mathbf{152}_{136}$, $\mathbf{153}_{34}$, $\mathbf{154}_{11}$, $\mathbf{155}_3$, and the wiring 165. Further, the gradation voltage VR540 is outputted from the output terminal of the decoder output DECOUT.

When a voltage value of the decoder output DECOUT raises, electric charges are accumulated in the node A 160 by the caused coupling capacity C1. As a result, the voltage value of the node A 160 rises.

Normally, the raised voltage value of the note A 160 is immediately let out to a VR796 side through NMOS transistors $\mathbf{141}_{796}$, $\mathbf{142}_{200}$, $\mathbf{143}_{50}$, $\mathbf{144}_{16}$ (in FIG. 8, the NMOS transistors inside a region of a dashed line C). Accordingly, no defect occurs. However, when $Vgs \approx VDD-Vt$ (Vt: a threshold voltage) in the NMOS transistors $\mathbf{141}_{796}$, $\mathbf{142}_{200}$, $\mathbf{143}_{50}$, $\mathbf{144}_{16}$, these NMOS transistors are in a high resistance state where gates are ON. Due thereto, electric charges accumulated in the node A 160 are slowly discharged. As a result, the voltage value drops gradually (refer to a specific example shown in (1) of FIG. 9).

With the voltage drop of the node A 160, a voltage value of the decoder output DECOUT is pulled by the coupling capacity C1, so that convergence at a target voltage (selected gradation voltage) is delayed (refer to (2) and (3) of FIG. 9). In the example shown in FIG. 9, when the voltage value of the decoder output DECOUT comes close to a range of about −5 mV from the target voltage, an amount of current flowing from the VR540 becomes minute. Due thereto, the voltage value is overwhelmed by the coupling capacity C1, resulting in delay of convergence at the target voltage. As a result, the delay of the decoder output is caused.

SUMMARY OF THE INVENTION

The present invention provides a decoder circuit that prevents the delay of decoder output.

A first aspect of the present invention is a decoder circuit including: a gradation-voltage output section, configured by a plurality of MOS transistors arrayed in a tournament manner with a plurality of hierarchies, that outputs, from an output terminal, a gradation voltage selected by a MOS transistor selected in accordance with a decode signal inputted to a first hierarchy among the plurality of hierarchies; and a discharge section that discharges electric charges accumulated in second wiring by a coupling capacity caused between first wiring connecting MOS transistors of a top hierarchy and the output terminal and the second wiring connecting between MOS transistors in adjacent hierarchies among the plurality of hierarchies.

The gradation-voltage output section of the decoder circuit of the first aspect of the present invention is configured such that the plural MOS transistors are arrayed in the tournament manner with the plural hierarchies. Moreover, the graduation-voltage output section outputs, from the output terminal, the gradation voltage selected by the MOS transistor selected in accordance with the decode signal from the plural gradation voltages inputted to the first hierarchy. When the selected gradation voltage is outputted from the output terminal, the coupling capacity may be caused by the first wiring connecting the MOS transistors in the top hierarchy of the gradation-voltage output section and the output terminal, and the second wiring connecting between the MOS transistors in the adjacent hierarchies. The discharge section discharges the electric charges accumulated in the second wiring by the caused coupling capacity. In this manner, the decoder circuit of the first aspect of the present invention can discharge the electric charges accumulated in the second wiring by the caused coupling capacity. Thus, the decoder circuit of the first aspect of the present invention can prevent a voltage outputted from the output terminal being pulled by the coupling capacity. Accordingly, the decoder circuit of the first aspect of the present invention can prevent the delay of the decoder output.

In a second aspect of the present invention, in the first aspect, the discharge section may be configured by a switching section, one end of which is connected to the second wiring, and another end of which is connected to a portion having a potential lower than a potential of the electric charges accumulated in the second wiring.

In a third aspect of the invention, in the above aspects, the discharge section may be configured to discharge the electric charges accumulated in the second wiring when the second wiring is not selected by the decode signal.

In a fourth aspect of the invention, in the above aspects, the discharge section may be configured by a MOS transistor.

In a fifth aspect of the invention, in the above aspects, the gradation-voltage output section may include: a first gradation-voltage output section, configured by a plurality of NMOS transistors arrayed in a tournament manner with a plurality of hierarchies, and that outputs, from the output terminal, a gradation voltage selected by an NMOS transistor selected in accordance with the decode signal inputted to the first hierarchy among the plurality of hierarchies; and a second gradation-voltage output section, configured by a plurality of PMOS transistors arrayed in a tournament manner with a plurality of hierarchies, and that outputs, from the output terminal, a gradation voltage selected by a PMOS transistor selected in accordance with the decode signal inputted to the first hierarchy among the plurality of hierarchies, and the discharge section is configured by a switching section, one end of which is connected to the second wiring of the first gradation-voltage output section, and another end of which is connected to a portion having a potential lower than a potential of the electric charges accumulated in the second wiring.

The gradation-voltage output section of the decoder circuit of the fifth aspect of the present invention includes the first gradation-voltage output section and the second gradation-voltage output section. The first gradation-voltage output section is configured such as the plural NMOS transistors are arrayed in the tournament manner with the plural hierarchies. Moreover, the second gradation-voltage output section is formed such that the plural PMOS transistors are arrayed in the tournament manner with the plural hierarchies. The first gradation-voltage output section outputs, from the output terminal, the gradation voltage selected by the NMOS transistor selected in accordance with the decode signal from the plural hierarchies inputted to the first hierarchy. The second gradation-voltage output section outputs, from the output terminal, the gradation voltage selected by the PMOS transistor selected in accordance with the decode signal from the plural gradation-voltages inputted to the first hierarchy. The discharge section is made of the switching section, one end of which is connected to the second wiring of the first gradation-voltage output section, and another end of which is connected to the portion having the potential lower than the potential by the electric charges accumulated in the second wiring. This allows the decoder circuit of the fifth aspect of the present invention to discharge the electric charges accumulated in the second wiring by the coupling capacity caused in the second wiring of the first gradation-voltage output section.

In sixth aspect, in the fifth aspect, the switching section may be configured by an NMOS transistor which is turned ON/OFF by the decode signal that selects a PMOS transistor included in the top hierarchy of the second gradation-voltage output section.

According to the present invention, the delay of the decoder output by the coupling capacity caused between the wirings can be prevented from being caused.

BRIEF DESCRIPTION OF THE DRAWINGS

Exemplary embodiments of the present invention will be described in detail based on the following figures, wherein.

DETAILED DESCRIPTION OF THE INVENTION

Figure 1:
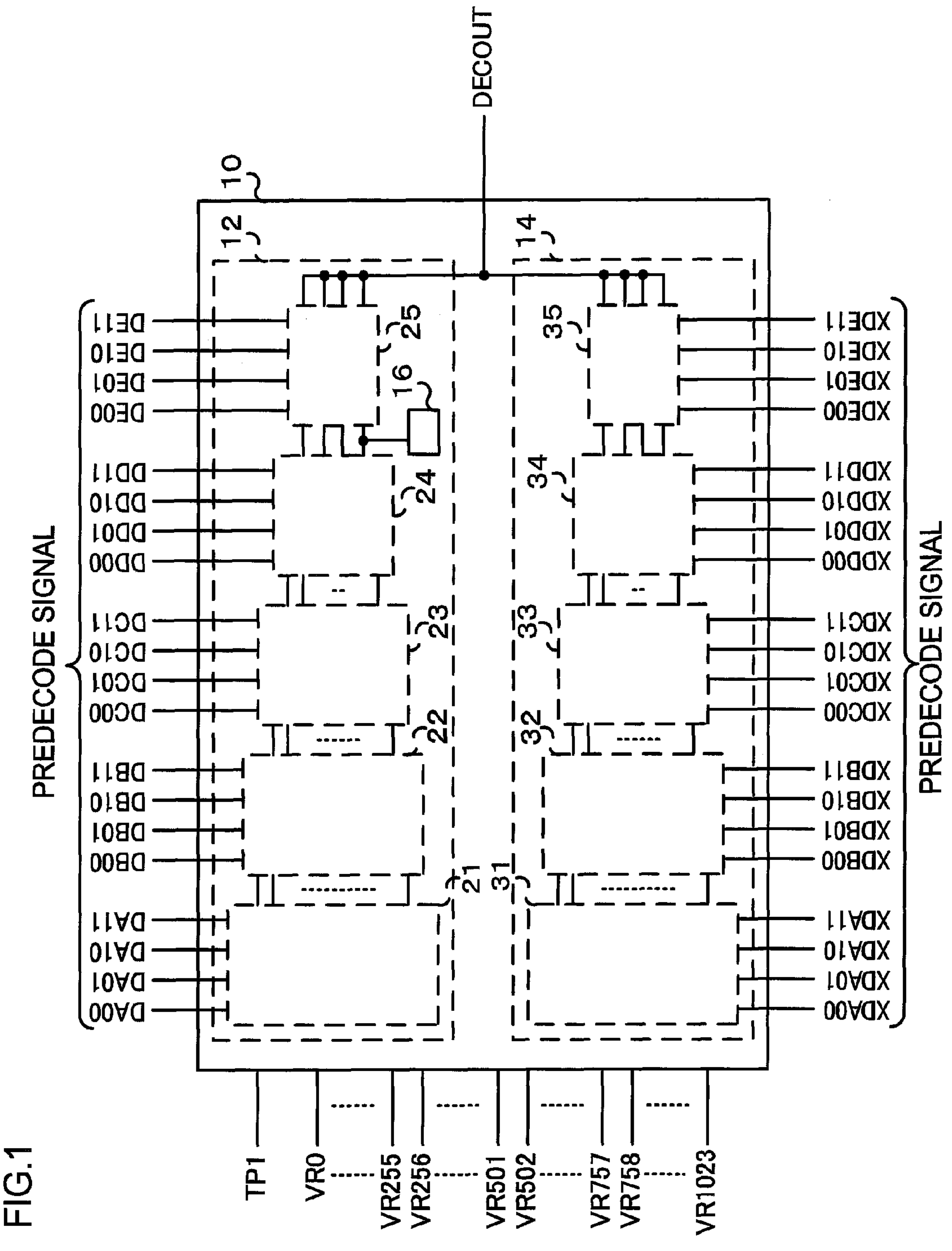
FIG. 1 is a schematic configuration diagram showing an example of a schematic configuration of a decoder circuit according to an exemplary embodiment of the present invention.

Hereinafter, referring to the drawings, a decoder circuit of an exemplary embodiment of the present invention is described in detail. FIG. 1 is a schematic configuration diagram showing an example of a schematic configuration of the decoder circuit of the exemplary embodiment. A decoder circuit 10 of the exemplary embodiment is a decoder circuit of a tournament system for use in an LCD drive device for 1024 gradation display. The decoder circuit 10 of the exemplary embodiment is a decoder circuit that performs decoding by a predecode signal. The decoder circuit of the present invention, however, may be a decoder circuit that performs decoding by a decode signal.

The decoder circuit 10 includes an NMOS region 12 (a first gradation-voltage output section), a PMOS region 14 (a second gradation-voltage output section) and a switch 16. The NMOS region 12 is configured by plural NMOS transistors arrayed in a tournament manner with a hierarchical structure of five hierarchies. The PMOS region 14 is configured by plural PMOS transistors arrayed in a tournament manner with a hierarchical structure of five hierarchies. The switch 16 is a discharge section for discharging electric charges accumulated in a coupling capacity caused by outputting a gradation voltage from an output terminal, in a predetermined node (node A 60) in the NMOS region. Operation of the decoder circuit 10 is controlled by a TP1 signal inputted externally (details of which will be described later).

ON/OFF of the NMOS transistors included in a first hierarchy (bottom layer) 21 of the NMOS region 12 is controlled by predecode signals inputted to the predecode signal lines DA00 to DA11. ON/OFF of the NMOS transistors included in a second hierarchy 22 of the NMOS region 12 is controlled by predecode signals inputted to the predecode signal lines DB00 to DB11. ON/OFF of the NMOS transistors included in a third hierarchy 23 of the NMOS region 12 is controlled by predecode signals inputted to the predecode signal lines DC00 to DC11. ON/OFF of the NMOS transistors included in a fourth hierarchy 24 of the NMOS region 12 is controlled by predecode signals inputted to the predecode signal lines DB00 to DB11. ON/OFF of the NMOS transistors included in a fifth hierarchy (top layer) 25 of the NMOS region 12 is controlled by predecode signals inputted to the predecode signal lines DE00 to DE11. During the decode operation, among the predecode signals inputted to each of the hierarchies, only one (of one line) thereof is a signal indicating ON (in the exemplary embodiment, an "H level signal"), and the other three (of three lines) are signals indicating OFF (in the exemplary embodiment, an "L level signal").

Further, ON/OFF of the PMOS transistors included in a first hierarchy (bottom layer) 31 of the PMOS region 14 is controlled by predecode signals inputted to the predecode signal lines XDA00 to XDA11. ON/OFF of the PMOS transistors included in a second hierarchy 32 of the PMOS region 14 is controlled by predecode signals inputted to the predecode signal lines XDB00 to XDB11. ON/OFF of the PMOS transistors included in a third hierarchy 33 of the PMOS region 14 is controlled by predecode signals inputted to the predecode signal lines XDC00 to XDC11. ON/OFF of the PMOS transistors included in a fourth hierarchy 34 of the PMOS region 14 is controlled by predecode signals inputted to the predecode signal lines XDD00 to XDD11. ON/OFF of the PMOS transistors included in a fifth hierarchy (top layer) 35 of the PMOS region 14 is controlled by predecode signals inputted to the predecode signal lines XDE00 to XDE11. During the decode operation, among the predecode signals inputted to each of the hierarchies, only one (of one line) thereof is a signal indicating ON (in the exemplary embodiment, the "L level signal"), and the other three (of three lines) are signals indicating OFF (in the exemplary embodiment, the "H level signal").

In the decoder circuit 10, with both the NMOS region 12 and the PMOS region 14, one MOS transistor (of one channel) is turned ON by the predecode signals of the four lines in each of the hierarchies. Due thereto, a gradation voltage selected from the gradation voltages at 1024 levels of the gradation voltages VR0 to VR1023 (gradation voltage corresponding to a selected gradation signal) is outputted from the decoder output terminal DECOUT to the outside of the decoder circuit 10.

In the exemplary embodiment, the gradation voltage VR0 is the lowest, and the voltage is incremented each time the gradation increases, and the gradation voltage VR1023 is the highest voltage.

Figure 2:
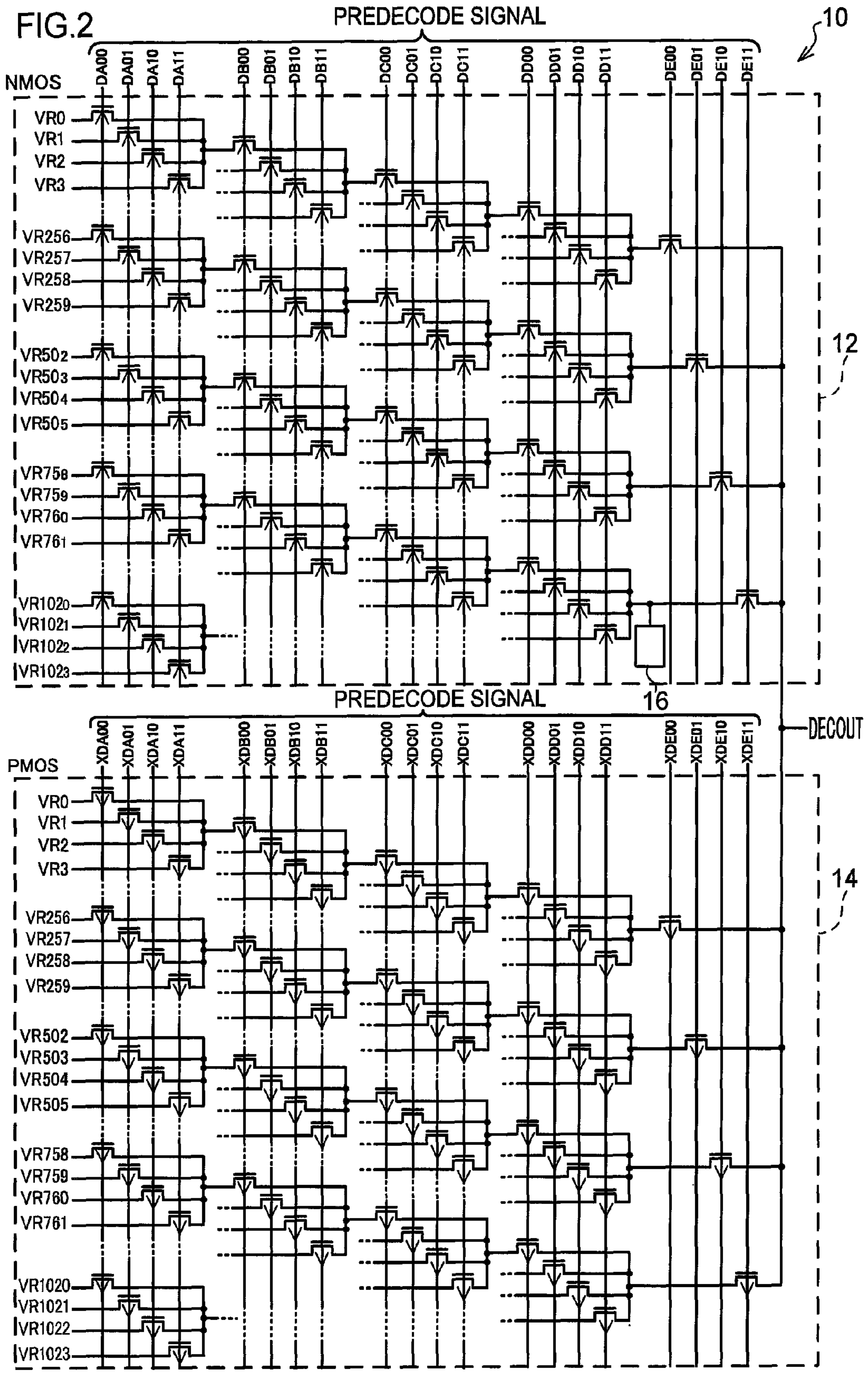
FIG. 2 is a circuit diagram showing an example of the schematic configuration of the decoder circuit according to the exemplary embodiment of the present invention.

FIG. 2 shows a circuit diagram showing an example of a schematic configuration of the decoder circuit 10 of the exemplary embodiment. Gates of the NMOS transistors included in the respective hierarchies of the NMOS region 12 are connected to the corresponding predecode signal lines. Moreover, sources of the NMOS transistors are connected to drains of the NMOS transistors of the previous hierarchy. Furthermore, drains of the NMOS transistors are connected to sources of the NMOS transistors of the subsequent hierarchy.

Gates of the PMOS transistors included in the respective hierarchies of the PMOS region 14 are connected to the corresponding predecode signal lines. Moreover, sources of the PMOS transistors are connected to drains of the PMOS transistors of the previous hierarchy. Furthermore, drains of the PMOS transistors are connected to sources of the PMOS transistors of the subsequent hierarchy.

Figure 3:
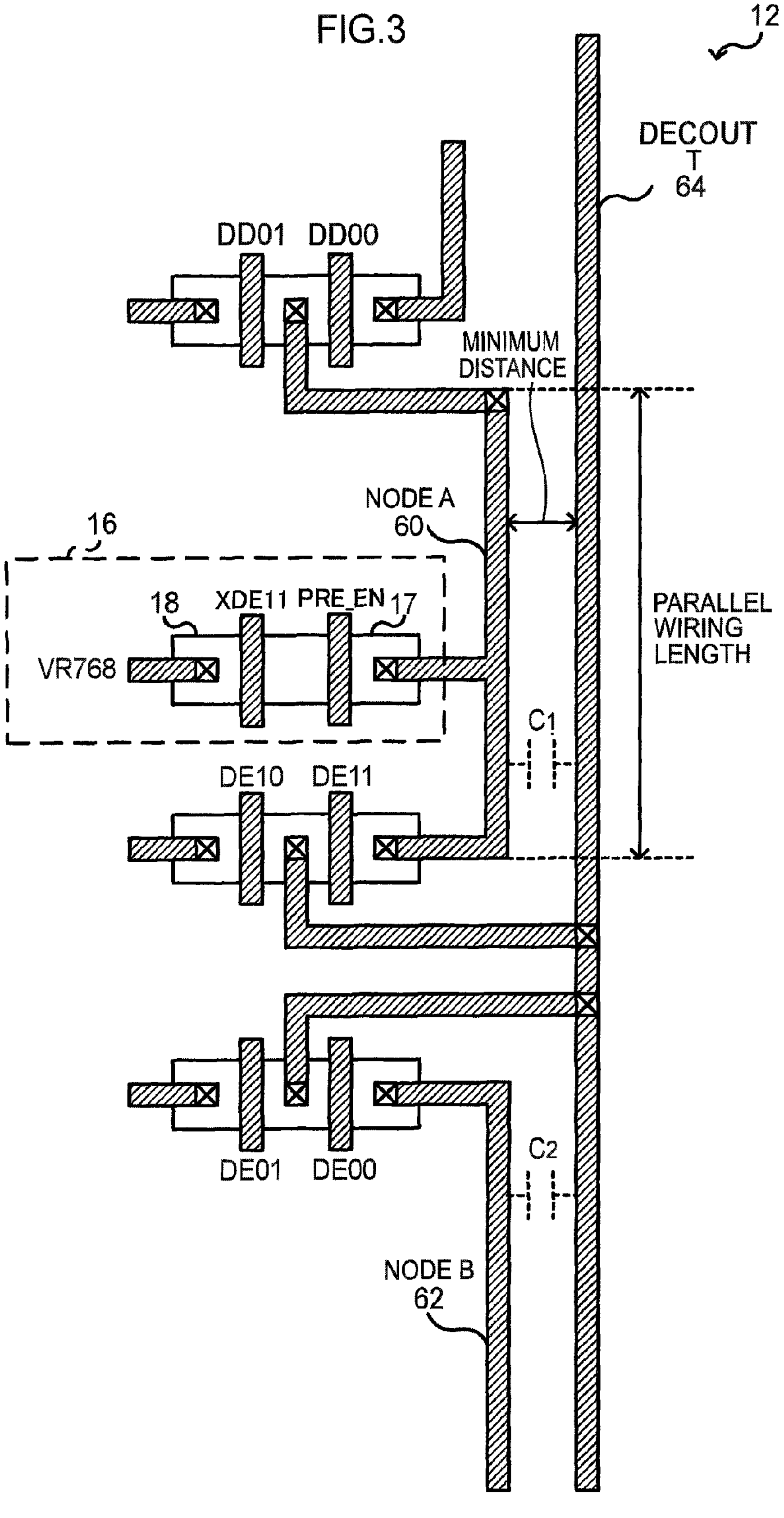
FIG. 3 is a layout diagram showing a specific example of a layout of the decoder circuit according to the exemplary embodiment of the present invention.
Figure 7:
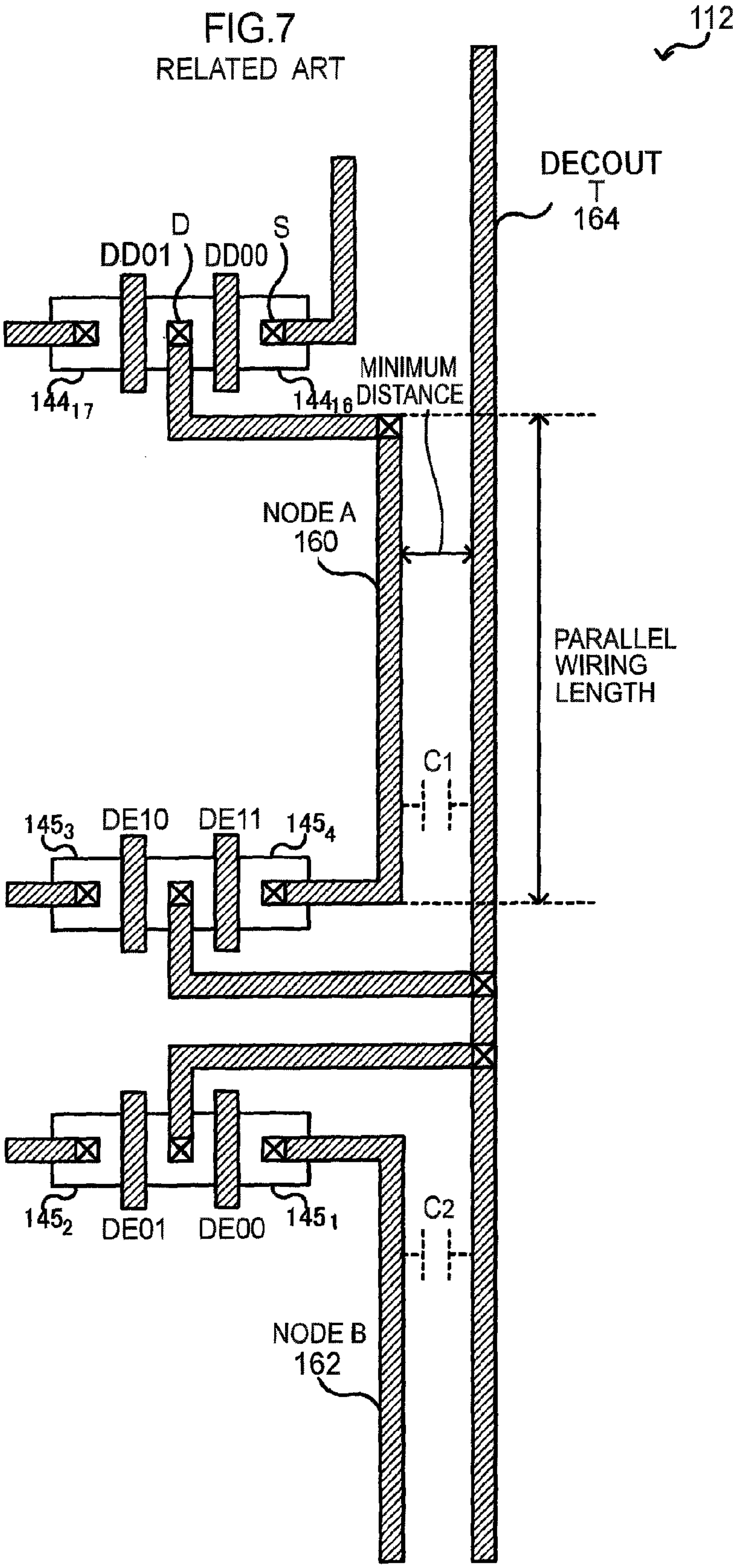
FIG.7 RELATED ART
FIG. 7 is a layout diagram showing a specific example of a layout of the decoder circuit in the related art.
Figure 8:
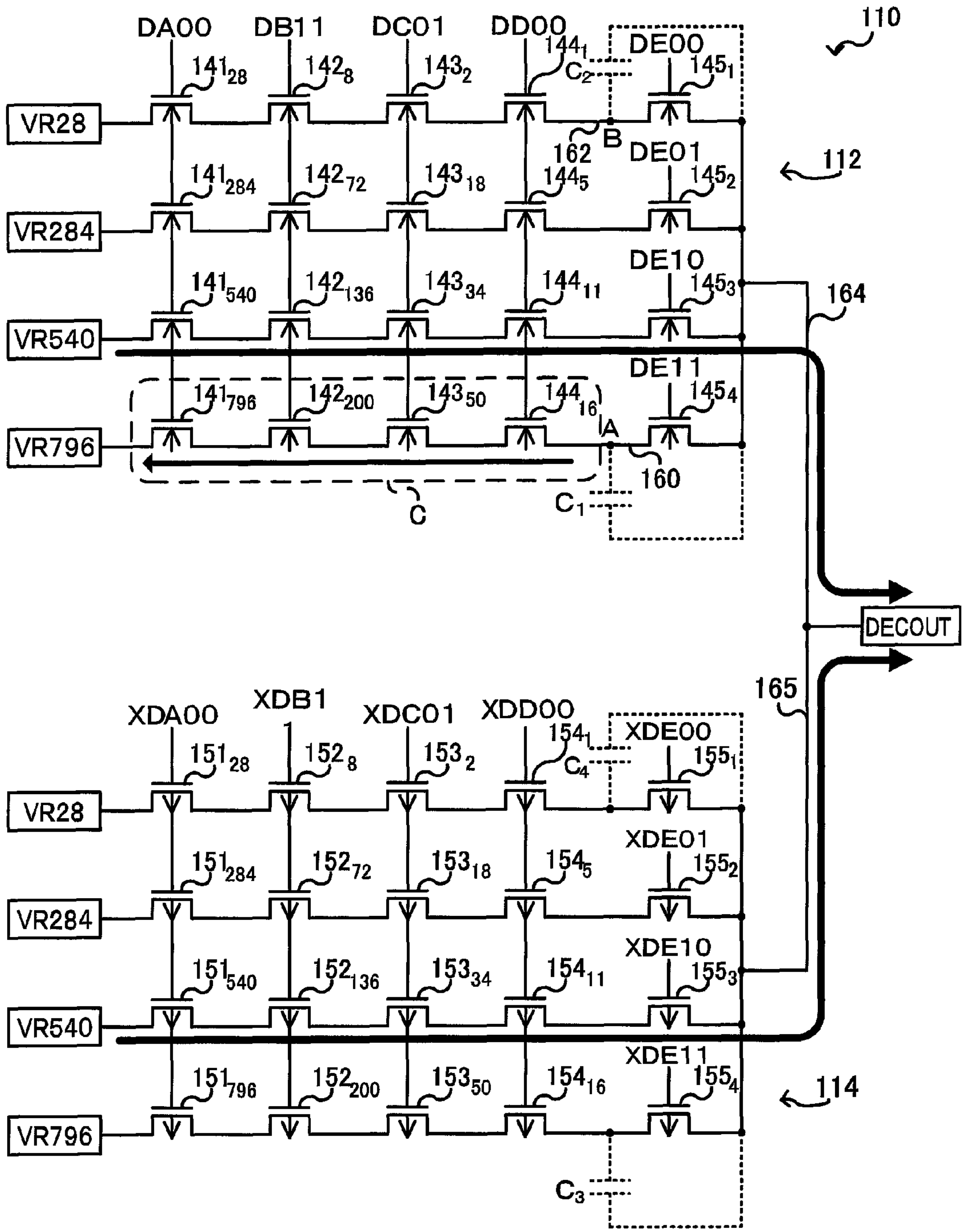
FIG.8 RELATED ART
FIG. 8 is a circuit diagram for explaining delay of decoder output DECOUT in the decoder circuit in the related art.
Figure 9:
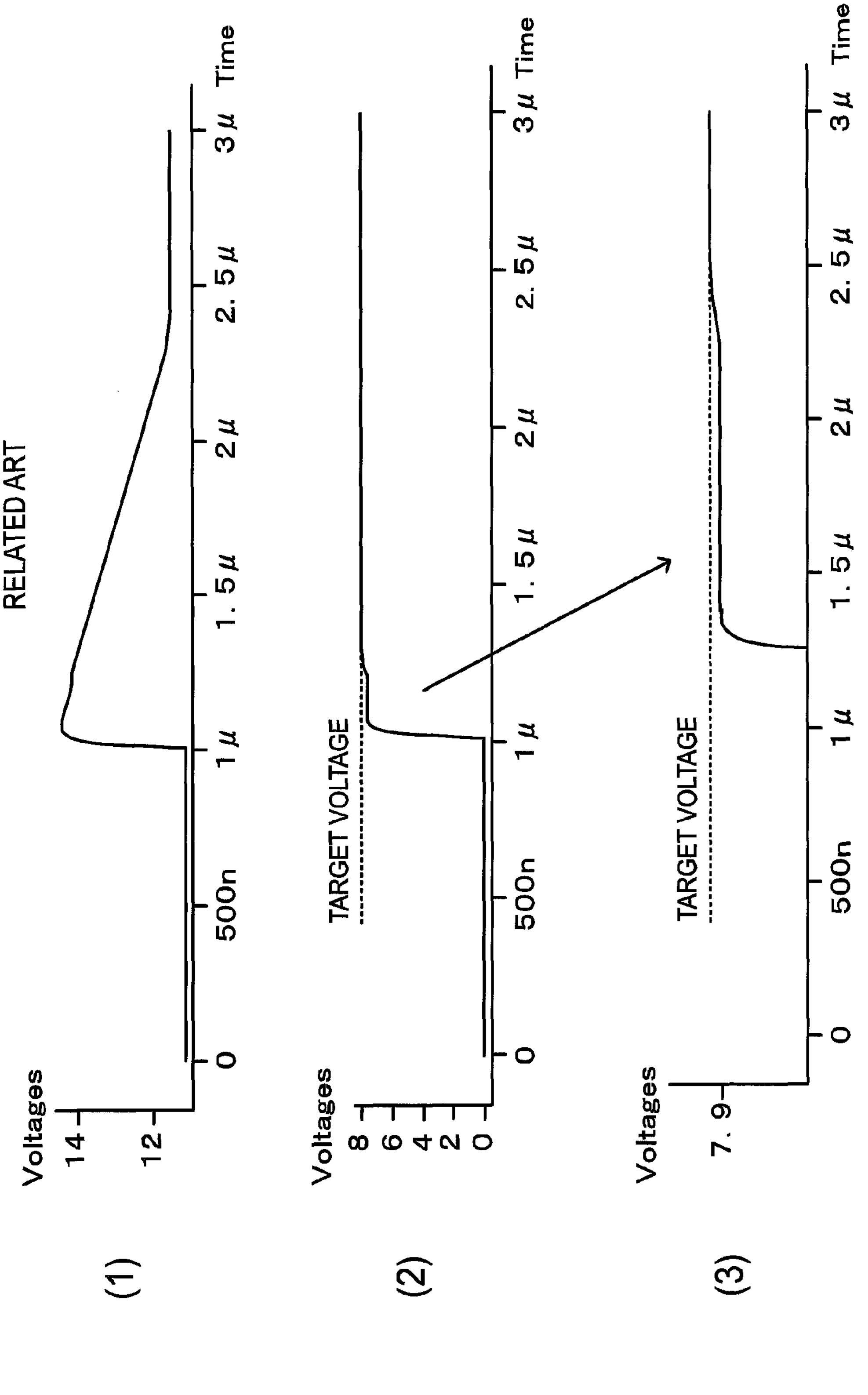
FIG.9 RELATED ART
FIG. 9 is an explanatory diagram showing a specific example of voltage drop of a node A, the delay of convergence at a target voltage of the decoder output DECOUT, and partially enlarged diagram of the decoder output DECOUT.

FIG. 3 shows a specific example of a layout of the decoder circuit 10 of the exemplary embodiment. Note that the example layout shown in FIG. 3 is an example layout of the circuit diagram of which is shown in FIG. 2. In the decoder circuit 10 of the layout shown in FIG. 3, a coupling capacity may be caused in the node A 60 as in the decoder circuit 110 as is shown in FIG. 7. Accordingly, the decoder circuit 10 of the exemplary embodiment includes the switch 16 for discharging (decreasing) a voltage of the node A 60 rose by the coupling capacity C1 caused in the node A 60. Note that, the switch 16 is a switching section as a discharge section.

One example of a specific configuration and operation of the switch 16 are described with reference to FIGS. 4 and 5. Here, a case where in the decoder circuit 10 having the layout shown in FIG. 3, when the gradation voltage VR540 is selected by the predecode signal to be outputted from the output terminal of the decoder output DECOUT, the coupling capacity C1 caused in the node A 60 is discharged by the switch 16, is described.

Figure 4:
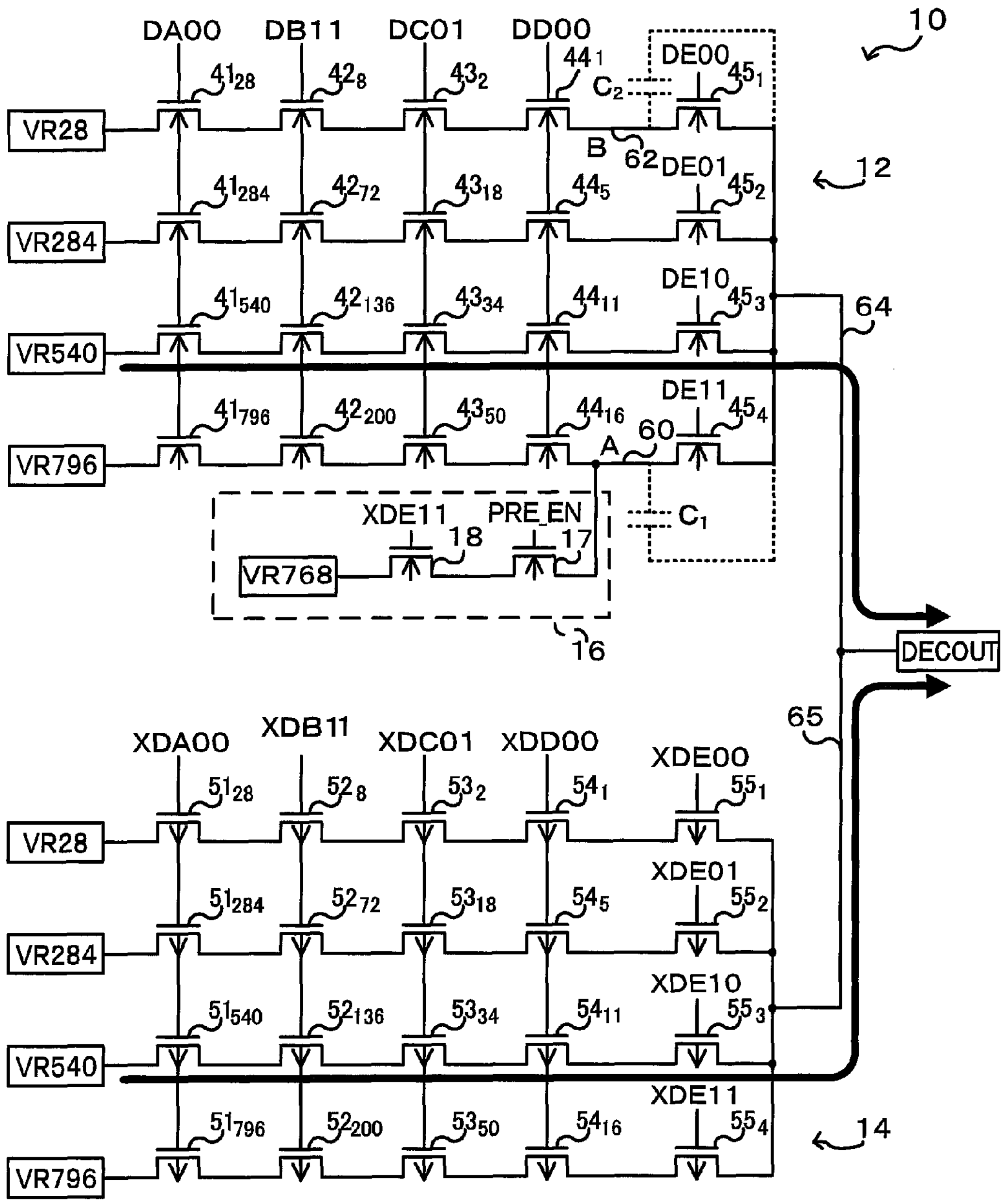
FIG. 4 is a circuit diagram for explaining a specific example of a switch (discharge section) in the decoder circuit according to the exemplary embodiment of the present invention.

FIG. 4 is a circuit diagram for explaining a specific example of the switch 16 in the decoder circuit 10. Moreover, FIG. 5 is a timing chart for explaining the decoder output DECOUT in the decoder circuit 10.

As shown in FIG. 4, the switch 16 of the present exemplary embodiment has a circuit configuration in which an NMOS transistor 17 and an NMOS transistor 18 are connected in series. A drain of the NMOS transistor 17 is connected to the node A 60. A source of the NMOS transistor 17 is connected to a drain of the NMOS transistor 18. Moreover, a precharge enable signal line PRE_EN is connected to a gate of the NMOS transistor 17. Further, a precharge enable signal (PRE_EN signal), which is a signal externally generated, is inputted to the precharge enable signal line PRE_EN.

The drain of the NMOS transistor 18 is connected to the source of the NMOS transistor 17. Moreover, a source of the NMOS transistor 18 is connected to a site having a potential lower than the voltage of the node A 60 caused by the coupling capacity C1 (e.g., an input terminal of a gradation voltage VR768). Moreover, to a gate of the NMOS transistor 18 is connected the predecode signal line XDE11, so that an inverse signal of the predecode signal DE11 is inputted to the predecode signal line XDE11.

In the decoder circuit 10 of the exemplary embodiment, the decoder operation is started by change of a TPI signal from 0 to 1 as a trigger.

When the gradation voltage VR540 is outputted from the output terminal of the decoder output DECOUT, in the NMOS region 12, the predecode signal lines DA00, DB11, DC01, DD00, DE10 each supply the H level signal. On the other hand, in the foregoing case, the other predecode signal lines each supply the L level signal. In the PMOS region 14, the predecode signal lines XDA00, XDB11, XDC01, XDD00, XDE10 each supply the L level signal. On the other hand, in the foregoing case, the other predecode signal lines each supply the H level signal. This brings NMOS transistors $\mathbf{41}_{540}$, $\mathbf{42}_{136}$, $\mathbf{43}_{34}$, $\mathbf{44}_{11}$, $\mathbf{45}_{3}$ of the NMOS region 12 into an ON state. As a result, the gradation voltage VR540 is outputted from the output terminal of the decoder output DECOUT. At this time, an NMOS transistor $\mathbf{45}_4$ is in an OFF state. Accordingly, the coupling capacity C1 (shown by a dashed line in FIG. 4) is caused, and thereby the voltage of the node A 60 rises.

ON/OFF of the NMOS transistor 18 of the switch 16 is controlled by the predecode signal 303E11, which is an inverse signal of the predecode signal DE11. The predecode signal XDE11 puts the NMOS transistor 18 into an ON state while the NMOS transistor $\mathbf{45}_4$ is in the OFF state.

Moreover, the NMOS transistor 17 of the switch 16 is in an ON state while the precharge enable signal PRE_EN separately generated externally is "1 (H level)" (for a time T1). The precharge enable signal PRE_EN is a signal whose value is "1 (H level)" for the time T1 since the TPI signal has changed from "0" to "1". The time T1 is a value set in advance by simulation or the like, as a time appropriate for discharging the electric charges accumulated in the node A 60 by the coupling capacity C1.

Figure 5:
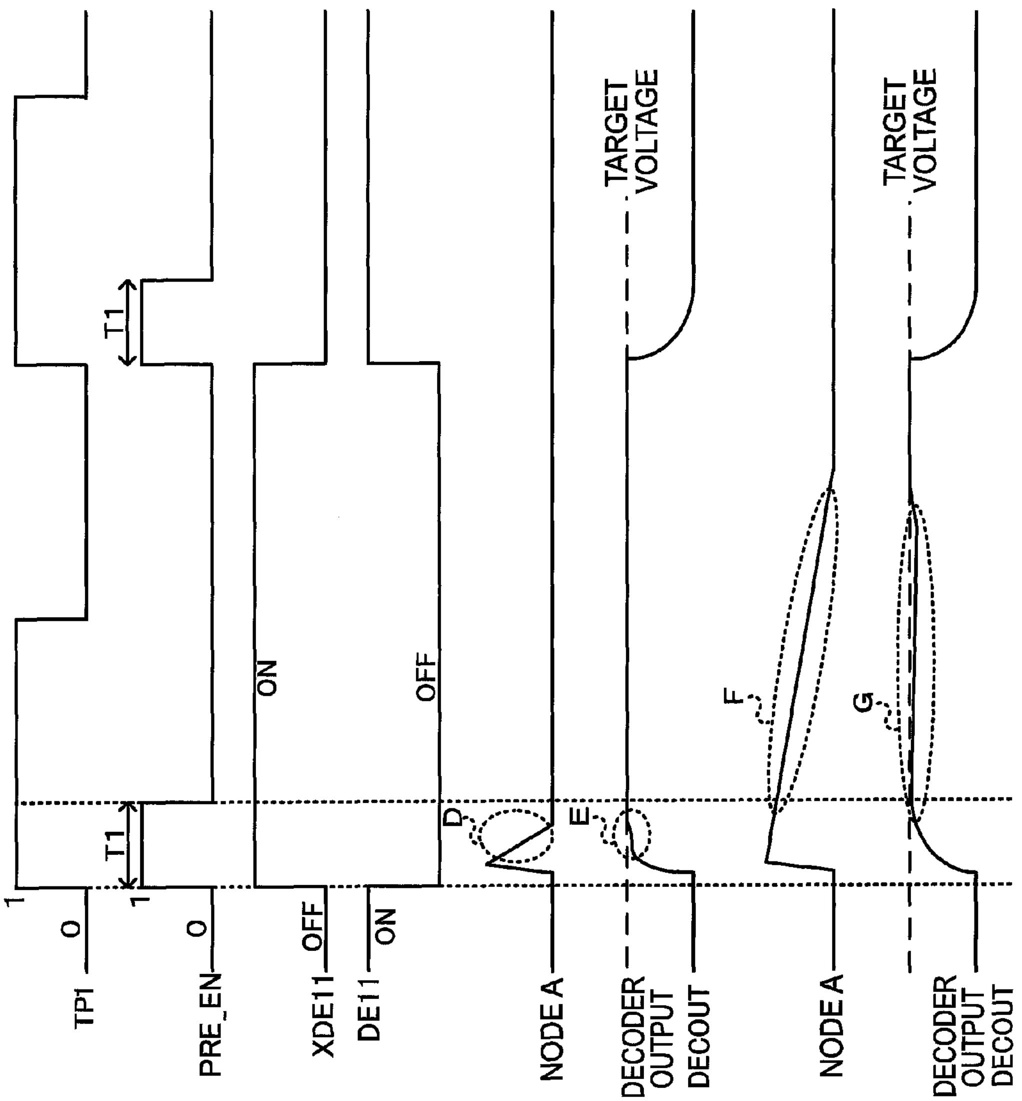
FIG. 5 is a timing chart for explaining decoder output DECOUT in the decoder circuit according to the exemplary embodiment of the present invention.
Figure 6:
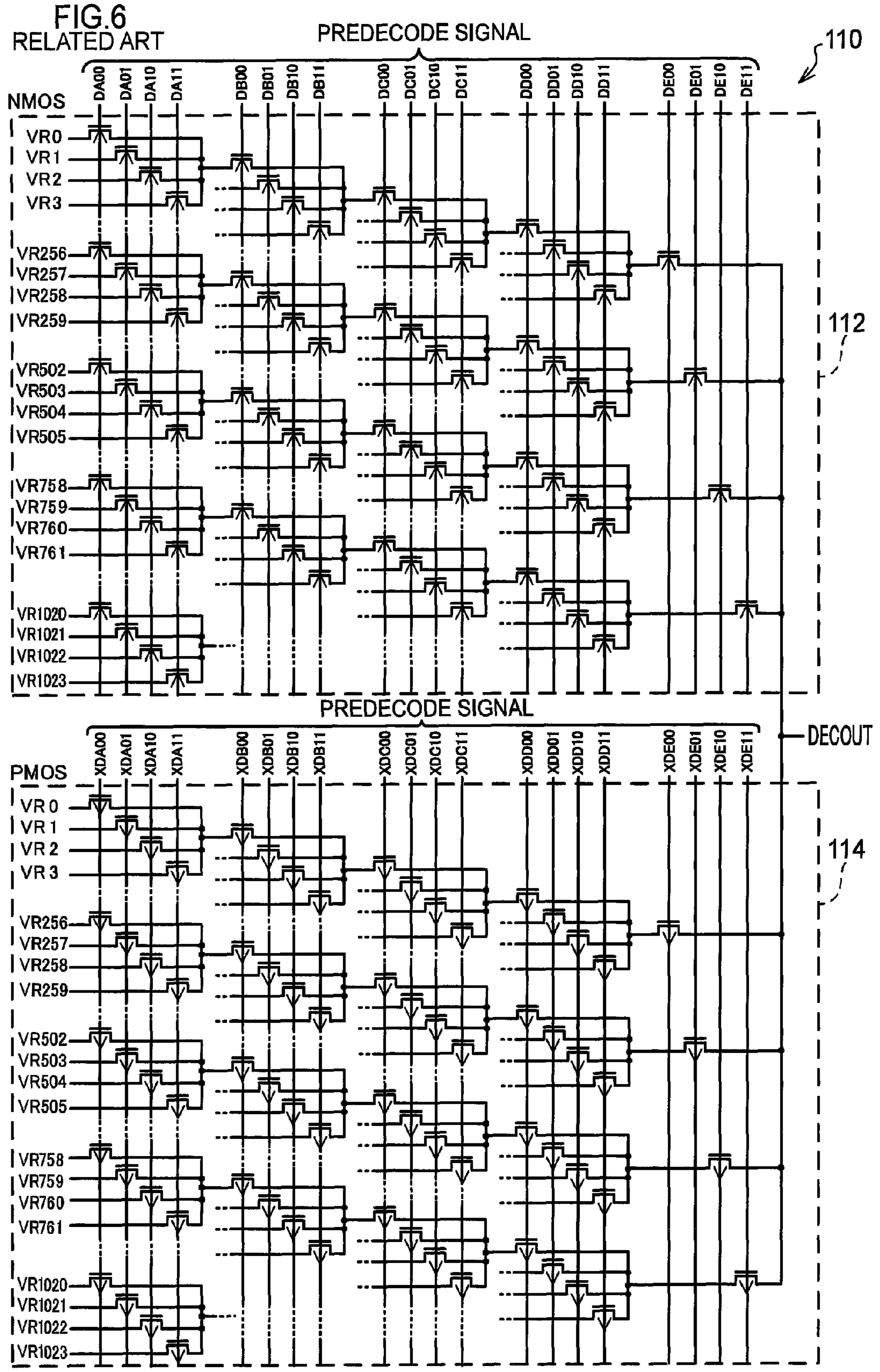
FIG.6 RELATED ART
FIG. 6 is a circuit diagram showing an example of a schematic configuration of a decoder circuit in the related art.

As shown in FIG. 5, in the exemplary embodiment, once the TP1 signal changes from "0" to "1", the precharge enable signal PRE_EN becomes "1 (H level)" while the time T1. Furthermore, since the predecode signal XDE11 becomes an H level signal, both the NMOS transistor 17 and the NMOS transistor 18 of the switch 16 are put into an ON state. As the result, the electric charges accumulated in the node A 60 (raised voltage) are immediately discharged through the NMOS transistor 17 and the NMOS transistor 18 (refer to a region D indicated by a dashed line). Due thereto, the exemplary embodiment can prevent the decoder output DECOUT voltage being pulled by the coupling capacity C1. Accordingly, in the exemplary embodiment, the decoder output DECOUT is immediately converged at the target voltage (selected gradation voltage) (refer to a region E indicated by a dashed line). Accordingly, in the exemplary embodiment, the delay of the decoder output can be prevented.

For comparison, the two graphs from the bottom of FIG. 5 shows the change of the voltage value of the node A 160 and an output value of the decoder output DECOUT in the decoder circuit (the decoder circuit 110 in the related art), which does not include the switch 16 of the exemplary embodiment. In the decoder circuit 110 in the related art, the voltage of the node A 160 is slowly discharged as compared with that of the exemplary embodiment (refer to a region F indicated by a dashed line). Due thereto, the decoder output DECOUT, takes time to converge at the target voltage (selected gradation voltage) (refer to a region G indicated by a dashed line). Accordingly, in the decoder circuit 110 in the related art, the decoder output is delayed.

In the exemplary embodiment, the NMOS transistor 18 of the switch 16 is connected to the input terminal of the gradation voltage VR768. However, the present invention is not limited thereto. The NMOS transistor 18 may be connected to any other input terminal to which the VR signal of the gradation (gradation voltage) having a voltage smaller than the voltage of the node A 60 (especially, a voltage than a VDD-Vt of the NMOS transistor 17 and the NMOS transistor 18) is inputted.

Moreover, the switch 16 of the exemplary embodiment has the configuration including the NMOS transistor 17 and the NMOS transistor 18. However, the present invention is not limited thereto. Any other configuration that puts the switch 16 into an ON state for the time T1 set in advance may be employed. As an example, a configuration using only one of the NMOS transistor 17 and the NMOS transistor 18, a configuration using a PMOS transistor, or the like can be applied as the present invention. When the PMOS transistor is used in place of the NMOS transistor 18, the predecode signal DE11 to be inputted to the NMOS transistor $\mathbf{45}_4$ may be inputted to a gate of the PMOS transistor.

Moreover, in the exemplary embodiment, the case where the voltage of the node A 60 is raised by the coupling capacity C1 has been described. However, the present invention is not limited thereto. When a voltage of another node (wiring between the MOS transistors) is raised by a coupling capacity, the switch 16 may be connected to the node of interest. In this case, to the gate of the NMOS transistor 18 is inputted the predecode signal that is an inversion signal of the predecode signal to be inputted to a gate of the NMOS transistor on the lower hierarchy side of the node of interest. For example, as shown in FIGS. 3 and 4, when a coupling capacity C2 is caused in a node B 62, the NMOS transistor 17 of the switch 16 is connected to the node B 62. Furthermore, the predecode signal XDE00 is inputted to the gate of the NMOS transistor 18.

As described above, in the decoder circuit 10 of the exemplary embodiment, the delay of the decoder output, caused by the coupling capacity C1 caused in the node A 60 by the node A 60 and the wiring of the decoder output DECOUT being adjacent and parallel to each other, can be prevented.

In the decoder circuit 10 of the exemplary embodiment, to the note A60 is connected the switch 16, which is put into an ON state when the node A 60 of the NMOS region 12 is not the output channel of the selected gradation voltage. Thus, when the gradation voltage is outputted from the output terminal of the decoder output DECOUT, the voltage raised by electric charges being accumulated in the coupling capacity C1 caused in the node A 60 can be discharged by the switch 16 in the ON state. By the above-described configuration, the decoder circuit 10 of the exemplary embodiment allows to discharge in a short period of time, so that the voltage of the node A 60 can be decreased. Thus, in the decoder circuit 10 of the exemplary embodiment, the voltage of the decoder output DECOUT being pulled by the coupling capacity C1 can be prevented. Accordingly, the decoder circuit 10 of the exemplary embodiment can prevent the delay of the decoder output.

What is claimed is:

1. A decoder circuit comprising:

a gradation-voltage output section, configured by a plurality of MOS transistors arrayed in a tournament manner with a plurality of hierarchies, that outputs from an output terminal a gradation voltage selected by a MOS transistor of the plurality of MOS transistors that is selected in accordance with a decode signal input to a first hierarchy among the plurality of hierarchies; and a discharge section that discharges electric charges accumulated in a second wiring by a coupling capacity caused between a first wiring connecting MOS transistors of the plurality of MOS transistors that are of a top hierarchy and the output terminal, and the second wiring connecting between MOS transistors of the plurality of MOS transistors that are in adjacent hierarchies among the plurality of hierarchies, wherein the discharge section discharges the electric charges accumulated in the second wiring for a predetermined period from when a start signal which starts operation of the decoder circuit is changed from an OFF state to an ON state.

2. The decoder circuit of claim 1, wherein the discharge section is configured by a switching section, one end of which is connected to the second wiring, and another end of which is connected to a portion having a potential lower than a potential of the electric charges accumulated in the second wiring.

3. The decoder circuit of claim 1, wherein the discharge section is configured to discharge the electric charges accumulated in the second wiring when the second wiring is not selected by the decode signal.

4. The decoder circuit of claim 1, wherein the discharge section is configured by a MOS transistor.

5. The decoder circuit of claim 1, wherein the gradation-voltage output section comprises:

a first gradation-voltage output section, configured by a plurality of NMOS transistors arrayed in a tournament manner with a plurality of hierarchies, and that outputs from the output terminal a gradation voltage selected by an NMOS transistor of the plurality of NMOS transistors that is selected in accordance with the decode signal input to the first hierarchy among the plurality of hierarchies; and a second gradation-voltage output section, configured by a plurality of PMOS transistors arrayed in a tournament manner with a plurality of hierarchies, and that outputs from the output terminal a gradation voltage selected by a PMOS transistor of the plurality of PMOS transistors that is selected in accordance with the decode signal input to the first hierarchy among the plurality of hierarchies, wherein the discharge section is configured by a switching section, one end of which is connected to the second wiring of the first gradation-voltage output section, and another end of which is connected to a portion having a potential lower than a potential of the electric charges accumulated in the second wiring.

6. The decoder circuit of claim 5, wherein the switching section is configured by an NMOS transistor which is turned ON and OFF by the decode signal that selects the PMOS transistor of the plurality of PMOS transistors included in the top hierarchy of the second gradation-voltage output section.

* * * * *